(12) United States Patent
Honda et al.

(10) Patent No.: US 9,237,677 B2
(45) Date of Patent: Jan. 12, 2016

(54) COOLING DEVICE, PRINTED CIRCUIT BOARD UNIT, AND ELECTRONIC DEVICE

(71) Applicant: FUJITSU LIMITED, Kawasaki-shi, Kanagawa (JP)

(72) Inventors: Shuji Honda, Kawasaki (JP); Masao Honda, Kato (JP)

(73) Assignee: FUJITSU LIMITED, Kawasaki (JP)

( * ) Notice: Subject to any disclaimer, the term of this patent is extended or adjusted under 35 U.S.C. 154(b) by 264 days.

(21) Appl. No.: 13/763,932

(22) Filed: Feb. 11, 2013

(65) Prior Publication Data

US 2013/0148299 A1  Jun. 13, 2013

Related U.S. Application Data

(63) Continuation of application No. PCT/JP2010/064825, filed on Aug. 31, 2010.

(51) Int. Cl.
| | |
|---|---|
| H05K 7/20 | (2006.01) |
| H01L 23/40 | (2006.01) |
| H01L 23/427 | (2006.01) |
| G06F 1/20 | (2006.01) |
| F28D 15/02 | (2006.01) |

(Continued)

(52) U.S. Cl.
CPC ........ *H05K 7/20336* (2013.01); *F28D 15/0233* (2013.01); *F28D 15/0275* (2013.01); *G06F 1/203* (2013.01); *H01L 23/4006* (2013.01); *H01L 23/427* (2013.01); *H01L 23/467* (2013.01); *H01L 2924/0002* (2013.01)

(58) Field of Classification Search
CPC .............. G06F 1/203; H05K 7/2029–7/20372; H01L 23/4006; H01L 23/427; F28D 15/0233; F28D 15/0275

USPC ........... 361/679.46–679.54, 688–723; 165/80.4–80.5, 104.33; 257/715, 257/E23.088; 174/15.2
See application file for complete search history.

(56) References Cited

U.S. PATENT DOCUMENTS

| | | | |
|---|---|---|---|
| 6,781,835 B2 * | 8/2004 | Hashimoto et al. | 361/697 |
| 7,321,492 B2 * | 1/2008 | Wang et al. | 361/709 |
| 7,414,850 B2 * | 8/2008 | Hung | 361/719 |

(Continued)

FOREIGN PATENT DOCUMENTS

| | | |
|---|---|---|
| JP | 3061953 U | 9/1999 |
| JP | 2003-101269 A | 4/2003 |

(Continued)

OTHER PUBLICATIONS

International Search Report for PCT/JP2010/064825, mailing date of Oct. 12, 2010.

(Continued)

*Primary Examiner* — Zachary M Pape
(74) *Attorney, Agent, or Firm* — Westerman, Hattori, Daniels & Adrian, LLP

(57) ABSTRACT

A cooling device includes: a heat sink and a heat pipe that are connected with each other; a metal plate that is connected with the heat pipe; an elastic member that is provided in the metal plate; and a securing member that is attachable with a printed circuit board on which a heating part is mounted, is able to be secured to the elastic member to be elastically deformed such that the metal plate is pushed to the heating part, and is able to position the metal plate in a state where the securing member is not secured to the elastic member.

7 Claims, 14 Drawing Sheets

(51) Int. Cl.
  *H01L 23/34* (2006.01)
  *H01L 23/467* (2006.01)

(56) References Cited

U.S. PATENT DOCUMENTS

| | | | |
|---|---|---|---|
| 7,697,298 B2* | 4/2010 | Chen | 361/719 |
| 8,243,450 B2* | 8/2012 | Takeguchi et al. | 361/700 |
| 2006/0181852 A1 | 8/2006 | Frank et al. | |
| 2008/0130240 A1 | 6/2008 | Wang et al. | |
| 2009/0004902 A1* | 1/2009 | Pandey et al. | 439/331 |
| 2009/0052131 A1* | 2/2009 | Fujiwara | 361/695 |
| 2010/0181049 A1* | 7/2010 | Chen | F28D 15/0233 165/104.26 |
| 2010/0307719 A1* | 12/2010 | Yang et al. | 165/104.26 |
| 2011/0267777 A1* | 11/2011 | Oike et al. | 361/697 |
| 2014/0092559 A1* | 4/2014 | Yamaguchi | H05K 7/20336 361/700 |

FOREIGN PATENT DOCUMENTS

| | | |
|---|---|---|
| JP | 2006-147618 A | 6/2006 |
| JP | 2006-332148 A | 12/2006 |
| JP | 2008-199058 A | 8/2008 |
| JP | 2009151367 A | 7/2009 |

OTHER PUBLICATIONS

Chinese Office Action dated Dec. 31, 2014, issued in corresponding CN Patent Application No. 201080068805.X, with English Translation (19 pages).

Japanese Office Action dated Jul. 15, 2014, issued in corresponding Japanese Patent Application No. 2012-531605 w/ English Translation (6 pages).

* cited by examiner

COOLING DEVICE, PRINTED CIRCUIT BOARD UNIT, AND ELECTRONIC DEVICE

CROSS-REFERENCE TO RELATED APPLICATIONS

This application is a continuation application of PCT/JP2010/064825, filed on Aug. 31, 2010, the entire contents of which are incorporated herein by reference.

FIELD

The embodiments discussed herein are related to a cooling device, a printed circuit board unit, and an electronic device.

BACKGROUND

There is known a cooling device for cooling a heating part mounted on a printed circuit board. Such a cooling device includes: a heat sink and a heat pipe connected with each other; and a metal plate pushed to the heating part connected with the heat pipe. Japanese Laid-open Patent Publication Nos. 2008-199058, 2006-147618, and 2003-101269 disclose a technology relevant to such a cooling device.

An elastic member is provided in the metal plate. The metal plate is secured to a printed circuit board while the elastic member is elastically deformed, so that the metal plate is pushed to the heating part by the elastic restoring three of the elastic member. A securing member which can secure the elastic member is beforehand assembled into or provided in the pruned circuit board. The elastic member and the securing member are secured to each other by, for example, screws. The work to secure the elastic member and the securing member is performed in a state where the printed circuit board and the cooling device are put on a work bench. Here, the heat pipe is made of metal having a rigidity. Thus, before the elastic member is secured to the securing member, the metal plate connected with the heat pipe may be floated from the heating part. Therefore, when the elastic member is secured to the securing member, the metal plate is positionally adjusted in the horizontal direction horizontal to the printed circuit board such that the elastic member is positioned above the securing member in the vertical direction. Next, the metal plate is pushed to the heating part such that the elastic member is brought into contact with the securing member. Next, the elastic member is secured to the securing member. The cooling device is assembled into the printed circuit board in such a way, so that the assembling property of the cooling device deteriorates.

SUMMARY

According to an aspect of the embodiments, a cooling device includes: a heat sink and a heat pipe that are connected with each other; a metal plate that is connected with the heat pipe; an elastic member that is provided in the metal plate; and a securing member that is attachable with a printed circuit board on which a heating part is mounted, is able to be secured to the elastic member to be elastically deformed such that the metal plate is pushed to the heating part, and is able to position the metal plate in a state where the securing member is not secured to the elastic member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
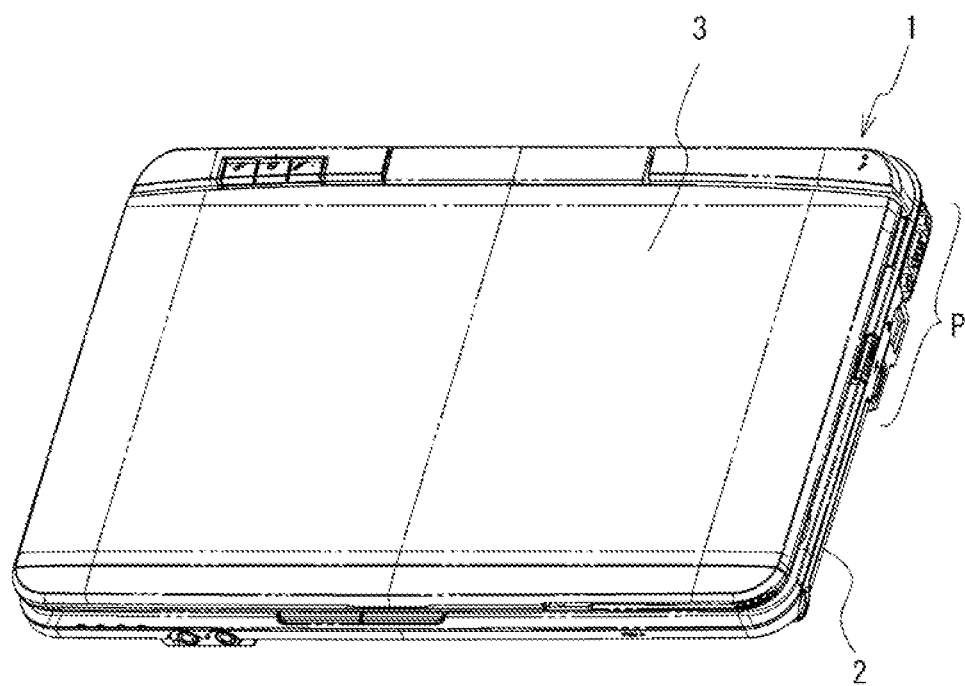
FIG. 1 is an explanatory view of an electronic device according to the present embodiment.
Figure 2:
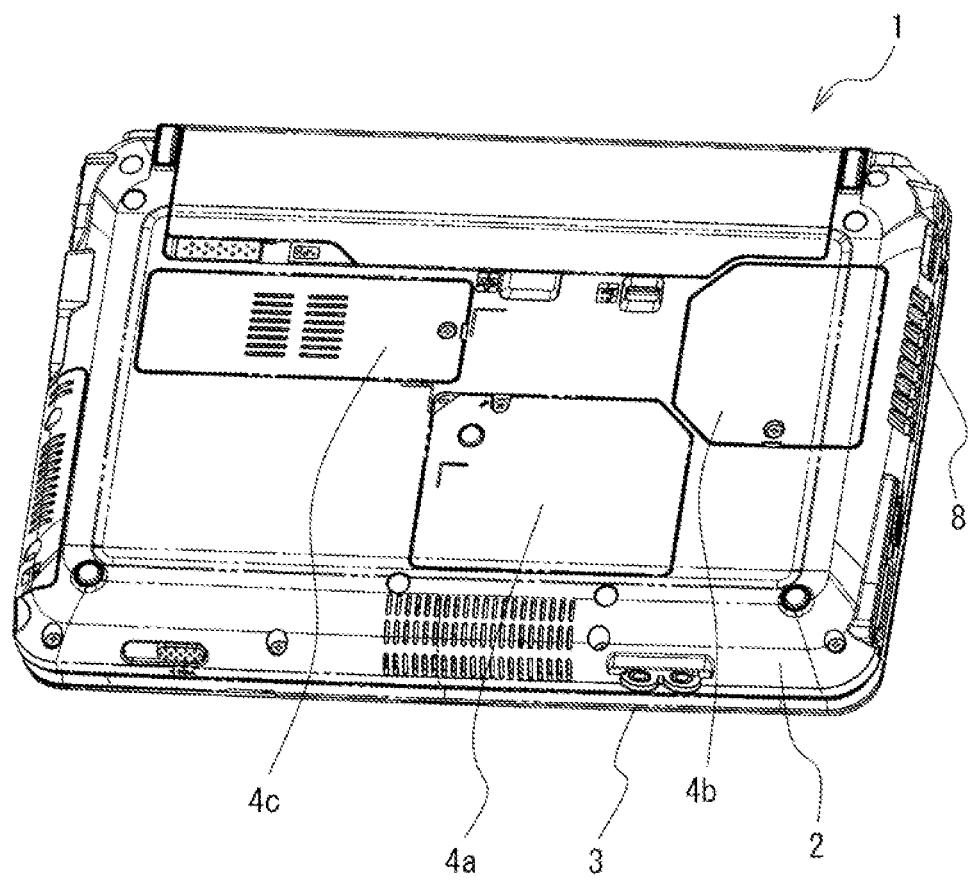
FIG. 2 is an explanatory view of the electronic device according to the present embodiment.

FIGS. 1 and 2 are explanatory views of an electronic device 1 according to the present embodiment.

The electronic device 1 is a notebook computer. FIG. 1 is a perspective view of an upper surface of the electronic device 1, and FIG. 2 is a perspective view of a bottom surface of the electronic device 1. The electronic device 1 includes a body portion 2 and a display portion 3 that are connected with each other so as to open and close. FIGS. 1 and 2 illustrate the electronic device 1 in the closed state. The body portion 2 houses a printed circuit board on which electronic parts for controlling the whole operation of the electronic device 1 are mounted. Ports P are provided on the side of the body portion 2. For example, the ports P are a USB port, a port for connecting a LAN, and a port for connecting an external display, but are not limited to these. The display portion 3 is provided with a liquid crystal display portion at a surface facing the body portion 2. As illustrated in FIG. 2, the bottom side of the body portion 2 is provided with plural covers 4a to 4c and vents 8 as will be described.

Figure 3:
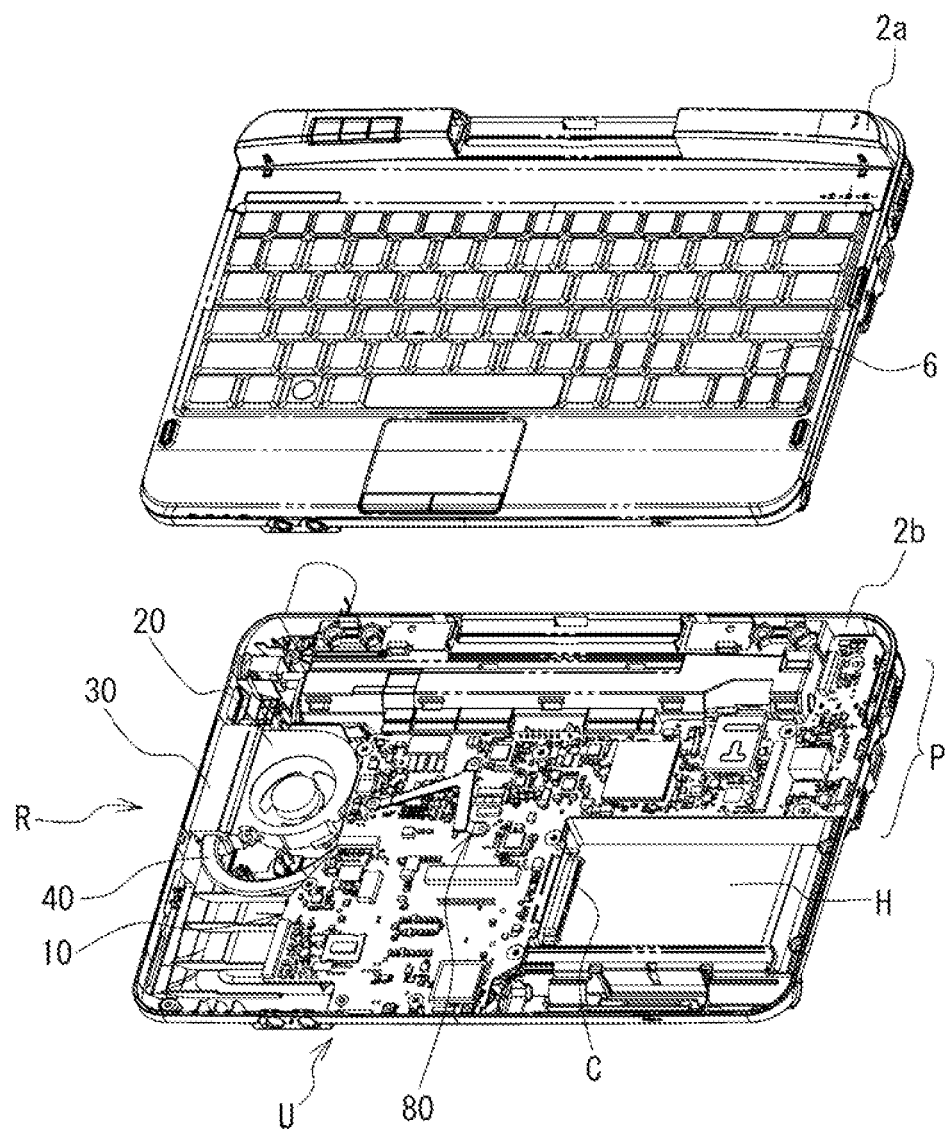
FIG. 3 is an explanatory view of the internal structure of a body portion.
Figure 4:
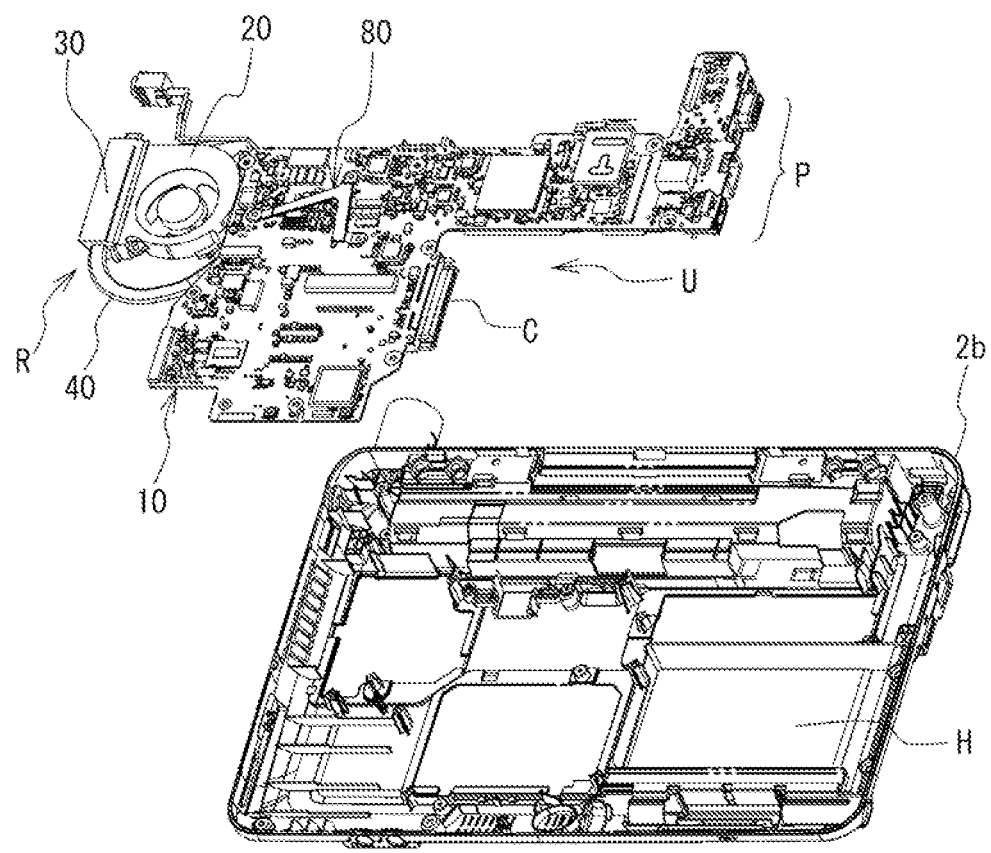
FIG. 4 is an explanatory view of the internal structure of the body portion.

FIGS. 3 and 4 are explanatory views of the internal structure of the body portion 2.

FIG. 3 illustrates the state where the display portion 3 is removed from the body portion 2 and housings 2a and 2b defining the body portion 2 are separated from each other. FIG. 4 illustrates the state where a fan 20 and a printed circuit board unit U are removed from the housing 2b. Additionally, FIG. 4 illustrates the state where the covers 4a to 4c are removed from the housing 2b. The printed circuit board unit U includes a cooling device R and a printed circuit board 10 into which the cooling device R is assembled. The cooling device R includes a heat sink 30, a heat pipe 40, a securing member 80, and a metal plate 50 as will be described later.

The upper side of the housing 2a is provided with a keyboard 6 for operating the electronic device 1. Within the housings 2a and 2b, the printed circuit board 10 corresponding to a motherboard of the electronic device 1 is housed. Also, within the housings 2a and 2b, a housing portion H for housing a hard disk drive is provided. Additionally, FIG. 3 illustrates the state where the hard disk drive is removed. The printed circuit board 10 is provided with a connector C connected with the hard disk drive. The ports P are provided in the printed circuit board 10. On the upper surface of the printed circuit board 10, the securing member 80 is attached. Also, within the housings 2a and 2b, the cooling device R is housed. The fan 20 is secured to the internal side of the housing 2a. The heat sink 30 is connected with one end of the heat pipe 40.

Figure 5:
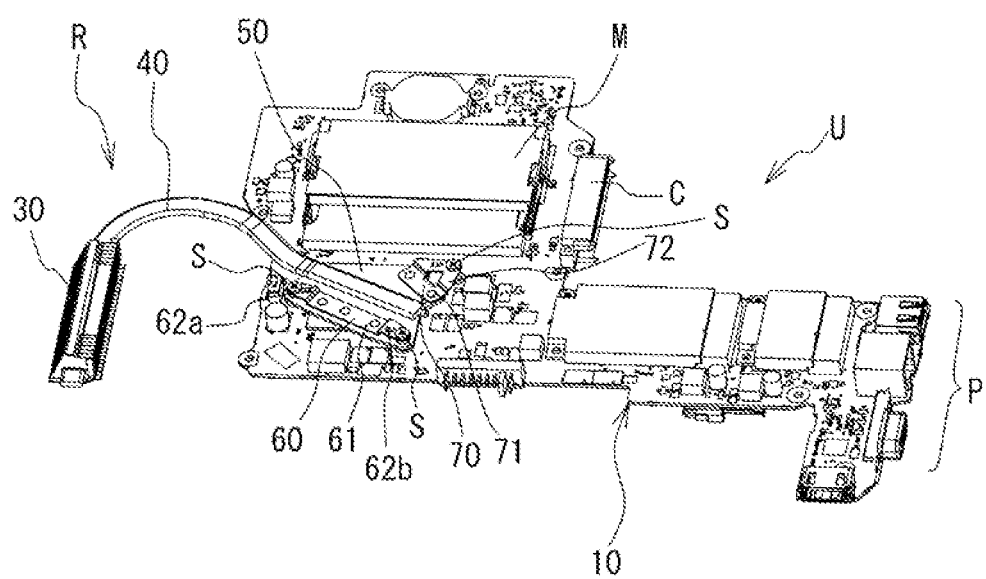
FIG. 5 is an explanatory view of a printed circuit board unit.
Figure 6:
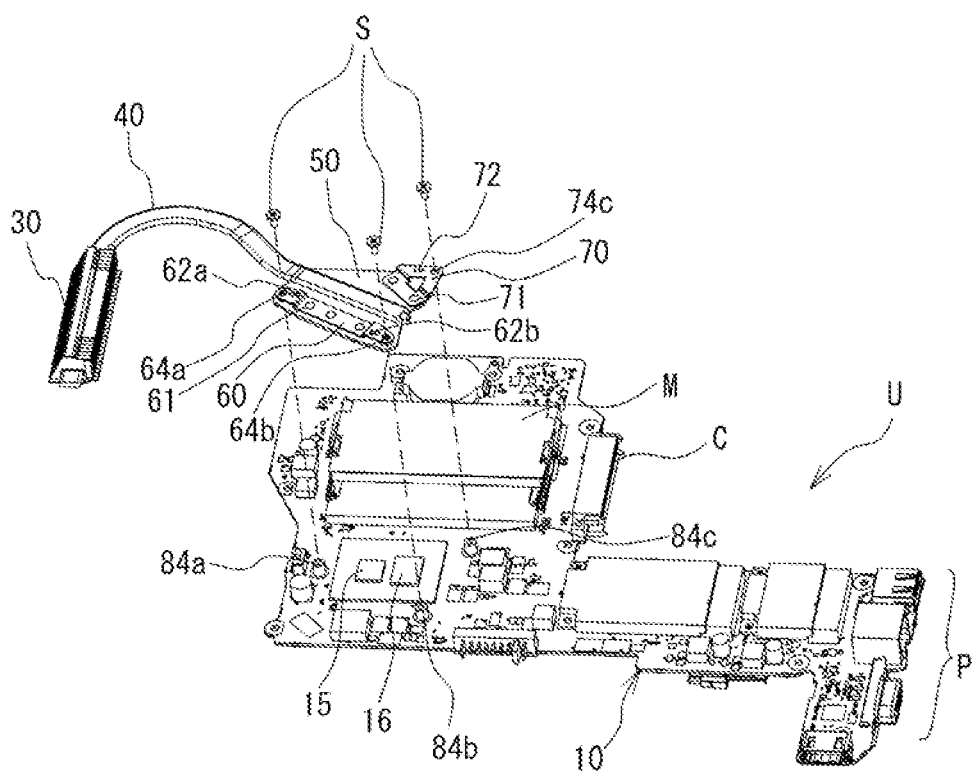
FIG. 6 is an explanatory view of the printed circuit board unit.

FIGS. 5 and 6 are explanatory views of the printed circuit board unit U.

FIG. 5 illustrates a rear side of the printed circuit board 10. One end of the heat pipe 40 is connected with the heat sink 30 and penetrates therethrough. The other end of the heat pipe 40 is secured to the metal plate 50 by welding. The metal plate 50 as will be described later in detail is secured to the securing member 80 so as to be assembled into the printed circuit board 10. A memory M is mounted on the pruned circuit board 10. The metal plate 50 is made of metal. Elastic members 60 and 70 are provided in the metal plate 50. The elastic members 60 and 70 are secured to the metal plate 50 by welding, but may be secured by another method. The elastic members 60 and 70 are metal leaf springs.

FIG. 6 illustrates the state where the metal plate 50 is removed from the printed circuit board 10. Heating parts 15 and 16 are provided on the printed circuit board 10. In the state that metal plate 50 is secured to the securing member 80, the metal plate 50 is pushed to the heating parts 15 and 16. Therefore, the heat pipe 40 is connected with the heating parts 15 and 16 via the metal plate 50. The heating parts 15 and 16 are semiconductor electronic parts such as CPUs, and are supplied with the power to be heated. Projections 84a to 84c protrude toward the metal plate 50 side through the printed circuit board 10. The projections 84a to 84c, as will be described later in detail, are provided in the securing member 80. The elastic members 60 and 70 provided in the metal plate 50 are secured to the projections 84a to 84c by screws S, whereby the metal plate 50 is assembled into the printed circuit board 10. The screw S is an example of a fastening part.

The heat sink 30 is made of a good heat-conductive metal such as copper or aluminum alloy. The heat pipe 40 is made of a high heat-conductive metal and is an airtight container having a cylinder shape. Volatile liquid as operating fluid is sealed within the heat pipe 40. When the heating parts 15 and 16 connected with the heat pipe 40 via the metal plate 50 are heated, the operating fluid evaporates and absorbs the latent heat. When the heat pipe 40 is cooled by the heat sink 30, the operating fluid evaporated in the heat pipe 40 condenses and radiates the latent heat. The heat is transferred from the heating parts 15 and 16 in this cycle. Additionally, the fan 20 sends the air to the heat sink 30 and cools the heat sink 30. The wind blowing from the fan 20 to the heat sink 30 is discharged out through the vents 8 formed in the body portion 2.

Figure 7A:
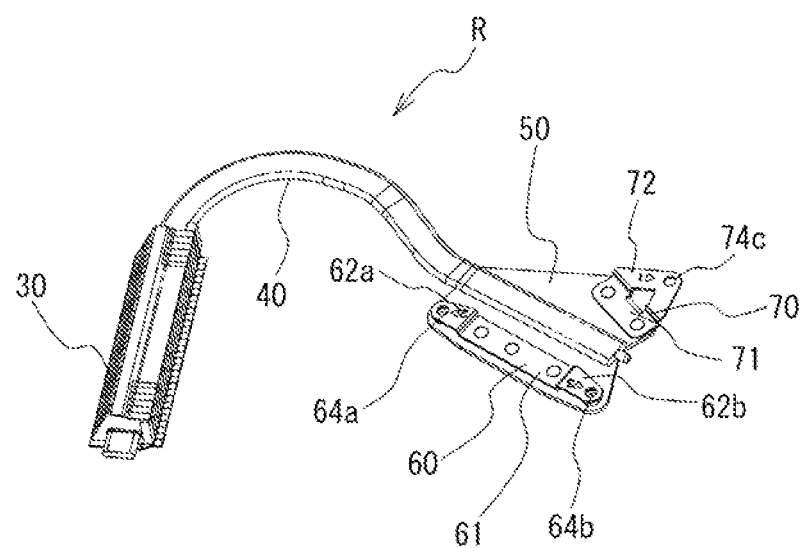
FIGS. 7A and 7B are explanatory views of a cooling device.
Figure 7B:
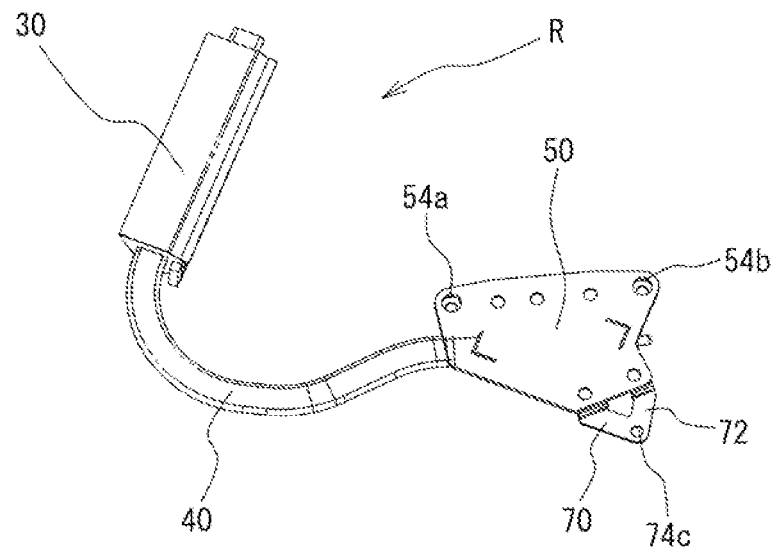

FIGS. 7A and 7B are explanatory views of the cooling device R.

FIG. 7A illustrates the upper side of the metal plate 50, and FIG. 7B illustrates the rear side of the metal plate 50. The elastic members 60 and 70 are secured to the upper side of the metal plate 50. The elastic member 60 has a long narrow shape extending in a predetermined direction, but is not limited to such a shape. The elastic member 60 includes: a securing portion 61 secured to the metal plate 50 by welding; and elastic pieces 62a and 62b continuous with the securing portion 61 and spaced apart from the metal plate 50. The elastic pieces 62a and 62b are substantially parallel to the metal plate 50. The elastic pieces 62a and 62b are located in the both end sides of the securing portion 61, respectively. The elastic pieces 62a and 6b are formed with securing holes 64a and 64b, respectively.

The elastic member 70 has a substantially pentagonal shape, but is not limited to such a shape. The elastic member 70 includes: a securing portion 71 secured to the metal plate 50 by welding; and an elastic piece 72 continuous with the securing portion 71 and extending outside the metal plate 50. The elastic piece 72 has a substantially triangle shape. The elastic piece 72 is formed with a securing hole 74c. Also, as illustrated in FIG. 7B, the metal plate 50 is provided with through-holes 54a and 54b.

The through-holes 54a and 54b respectively overlap with the securing holes 64a and 64b in die axial direction of the screw S and are respectively communicated therewith in the axial direction. The metal plate 50 is formed to be cutout around the securing hole 74c of the elastic member 70.

Figure 8:
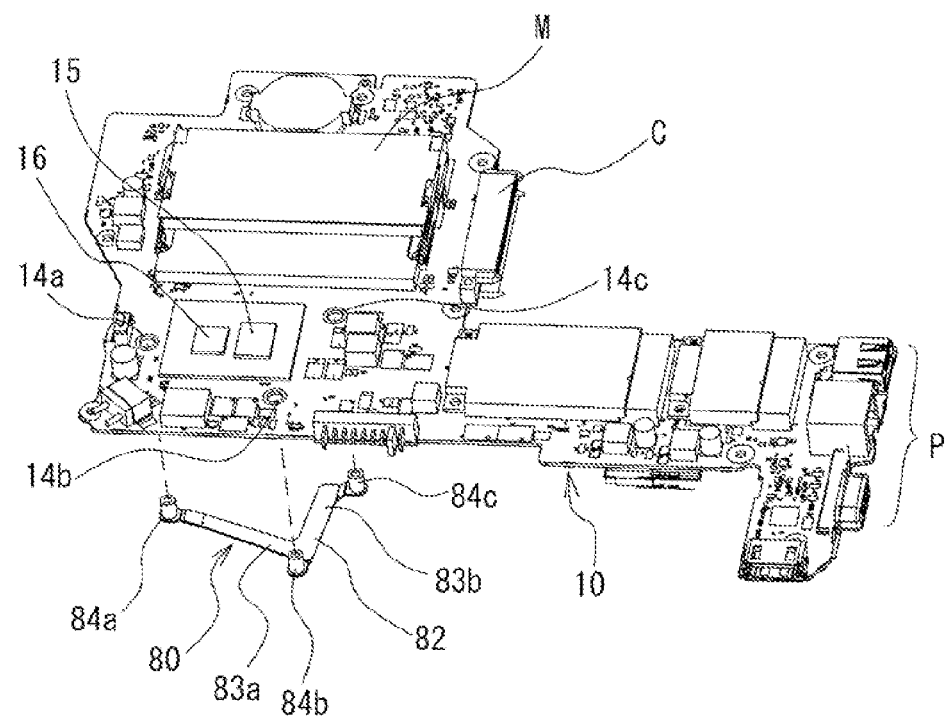
FIG. 8 is an explanatory view of a securing member.

FIG. 8 is an explanatory view of the securing member 80.

FIG. 8 illustrates the state where the securing member 80 is removed from the printed circuit board 10. The securing member 80 is made of metal. The securing member 80 includes: a base portion 82; and three projections 84a to 84c protruding from the base portion 82 in the same direction. The projections 84a to 84c each has a cylindrical shape that can be threadedly engaged with the screw S. The printed circuit board 10 is provided with through-holes 14a to 14c through which the projections 84a to 84c can respectively penetrate. The through-holes 14a to 14c are formed around the heating parts 15 and 16. The base portion 82 includes extended portions 83a and 83b which each has a substantially linear shape, are continuous with each other, and extend in the opposite direction. The projection 84a is provided at one end portion of the extended portion 83a. The projection 84b is provided in the vicinity of a boundary between the extended portions 83a and 83b. The projection 84c is provided at one end portion of an extended portion 83c. In such a way, the base portion 82 has a shape having two end portions.

The assembly of the cooling device R will be explained.

Figure 9:
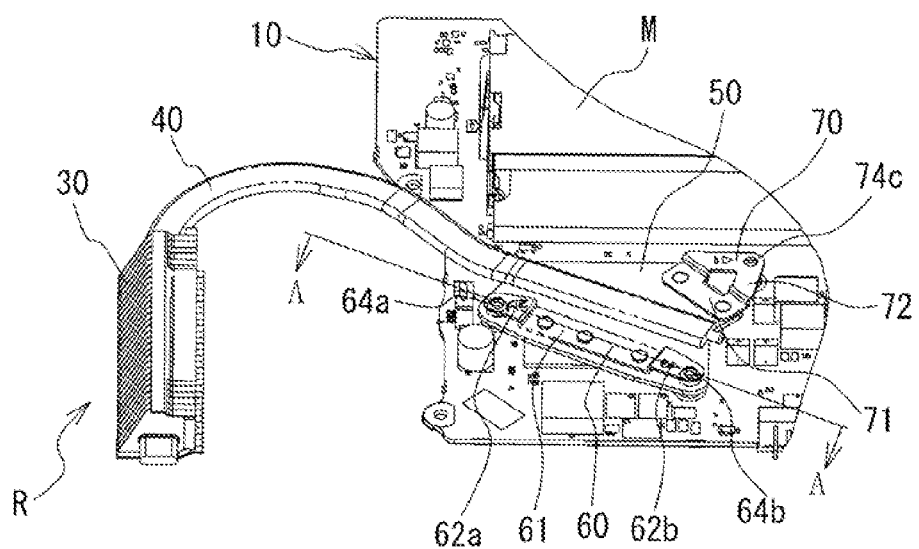
FIG. 9 is an explanatory view of the assembly of the cooling device.
Figure 10A:
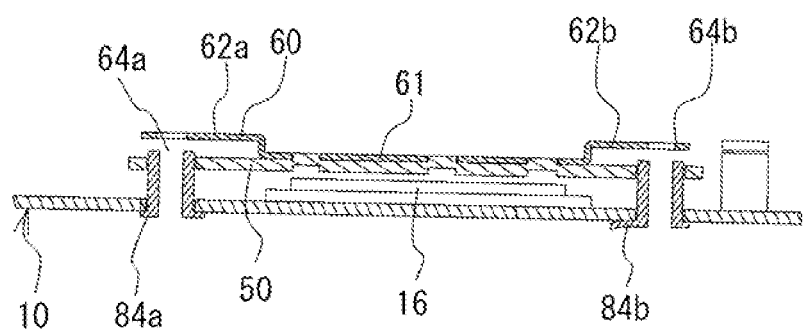
FIGS. 10A and 10B are explanatory views of the assembly of the cooling device.
Figure 10B:
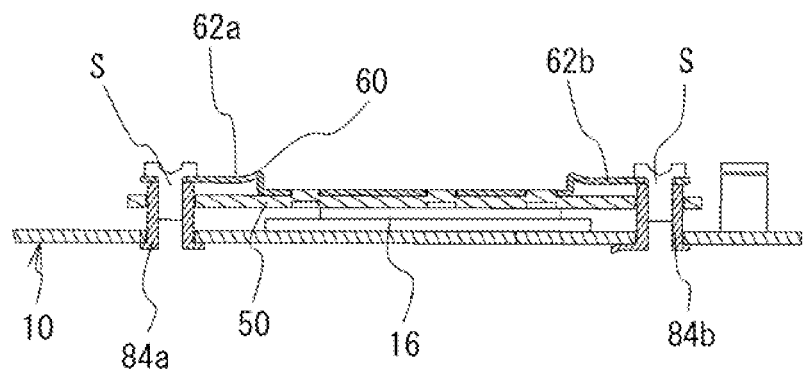

FIGS. 9, 10A, and 10B are explanatory views of the assembly of the cooling device R. The assembly of the cooling device R is performed by assembling the metal plate 50 into the printed circuit board 10. As for the assembly of the metal plate 50 into the printed circuit board 10, firstly, the securing member 80 is assembled into the printed circuit board 10 to respectively insert the projections 84a to 84c into the through-holes 14a to 14c of the printed circuit board 10. Therefore, the projections 84a to 84c protrude from the printed circuit board 10 in the same direction. Next, the metal plate 50 is assembled into the securing member 80 to respectively insert the projections 84a and 84b into the through-holes 54a and 54b. In such a way, the metal plate 50 is fitted onto the securing member 80. Additionally, the work to fit the metal plate 50 onto the securing member 80 is performed, for example, while the printed circuit board 10 and the cooling device R are put on it work bench. Also, the securing member 80 may loosely fit or tightly fit into the metal plate 50. The loose fit is preferable in consideration of the easiness of the assembling work.

FIG. 9 illustrates the state where the securing member 80 fits into the metal plate 50. FIG. 10A is a sectional view of taken along line A-A of FIG. 9. The projections 84a and 84b are respectively inserted into the through-holes 54a and 54b, thereby positioning the metal plate 50 with respect to the printed circuit board 10. Specifically, before the projections 84a to 84c are secured to the elastic members 60 and 70, the metal plate 50 is positioned in the direction parallel to the metal plate 50. As illustrated in FIG. 10A, in this state, the metal plate 50 may not abut with the heating parts 15 and 16. This is because the heat pipe 40 is made of metal having a rigidity and the metal plate 50 is floated depending on the position of the heat sink 30 in the direction perpendicular to the printed circuit board 10.

Next, the screw S is commonly inserted into the through-hole 54a and the securing hole 64a and is threadedly engaged with the projection 84a. Also, another screw S is commonly inserted into the through-hole 54b and the securing hole 64b and is threadedly engaged with the projection 84b. The other screw S is inserted into the securing hole 74c and is threadedly engaged with the projection 84c. Therefore, the elastic pieces 62a, 62b, and 72 are elastically deformed to come close to the projection 84a to 84c, respectively. The metal plate 50 is pushed to the heating parts 15 and 16 by the restoring force of the elastic pieces 62a, 62b, and 72. In the above way, the assembly of the cooling device R is completed. FIG. 10B is a sectional view of the state where the cooling device R is assembled. The metal plate 50 is pushed to the heating parts 15 and 16 by the restoring force of the elastic pieces 62a, 62b, and 72, whereby the metal plate 50 comes into close contact with the heating parts 15 and 16. It is thus possible to improve the cooling efficiency of the heating parts 15 and 16.

Also, the metal plate 50 is pushed to the heating parts 15 and 16, while the printed circuit board 10 is sandwiched between the metal plate 50 and the seeming member 80. Therefore, the printed circuit board 10 is suppressed from wrapping.

Here, a description will be given of a cooling device Rx having the structure different from that of the cooling device R according to the present embodiment.

Figure 11A:
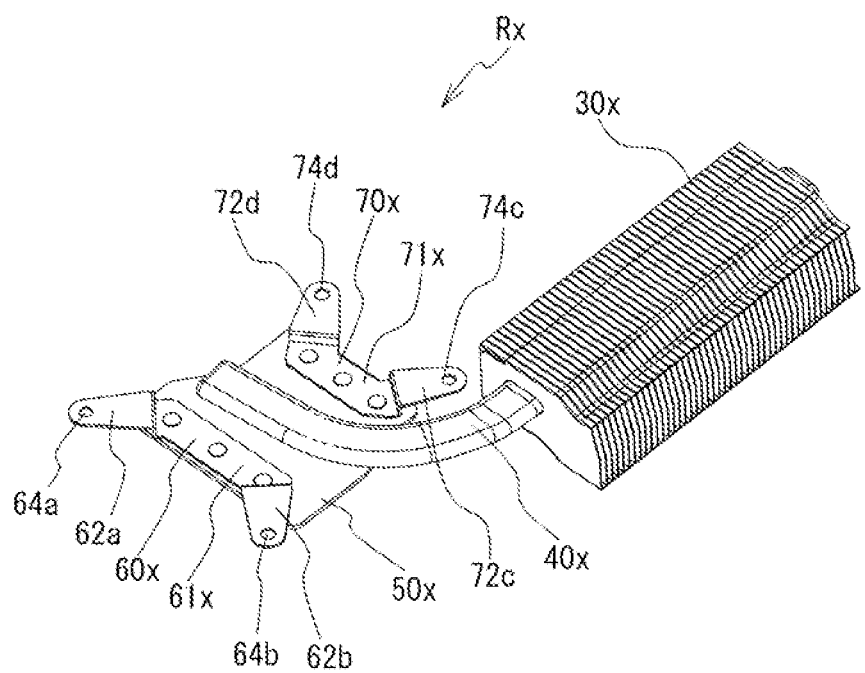
FIGS. 11A and 11B are explanatory views of a cooling device having the structure different from that of the cooling device according to the present embodiment.
Figure 11B:
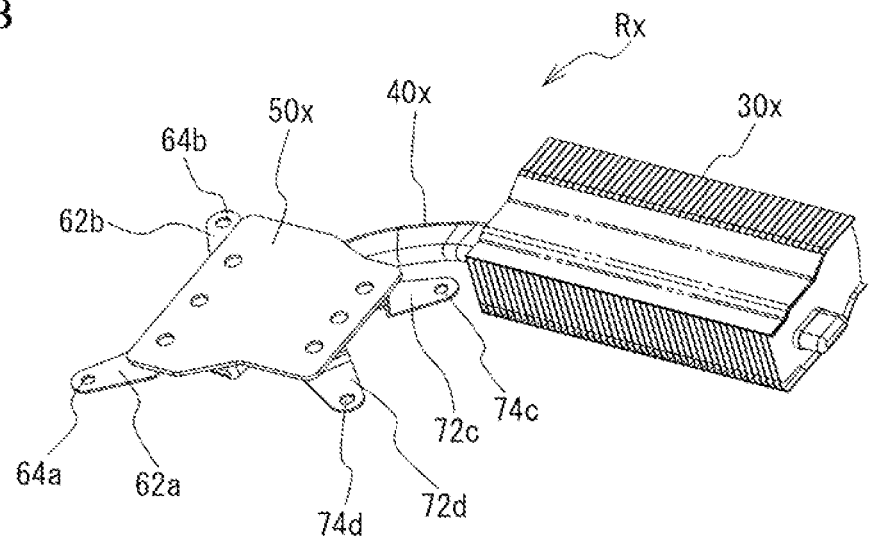

FIGS. 11A and 11B are explanatory views of the cooling device Rx having the structure different from the cooling device R according to the present embodiment. Elastic members 60x and 70x are secured to a metal plate 50x. Elastic pieces 62a and 62b of the elastic member 60x and elastic pieces 72c and 72d of the elastic member 70x extend outside of the metal plate 50x.

Figure 12:
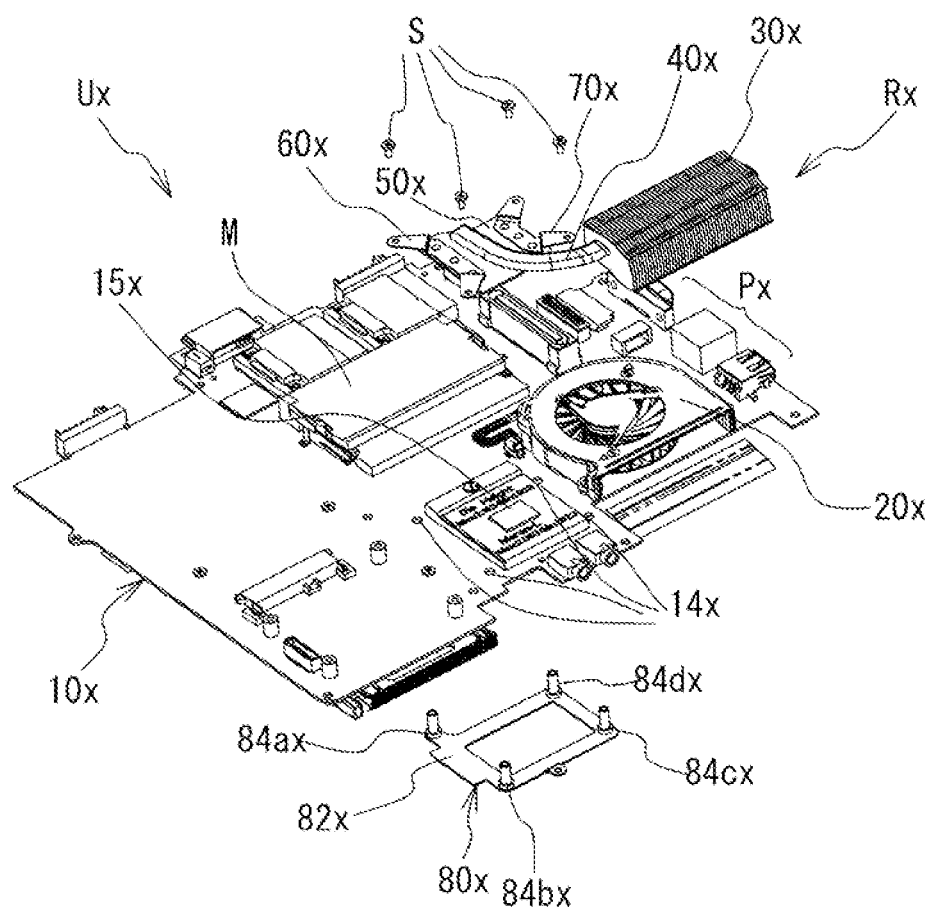
FIG. 12 is an explanatory view of the cooling device different from the present embodiment into a printed circuit board.
Figure 13:
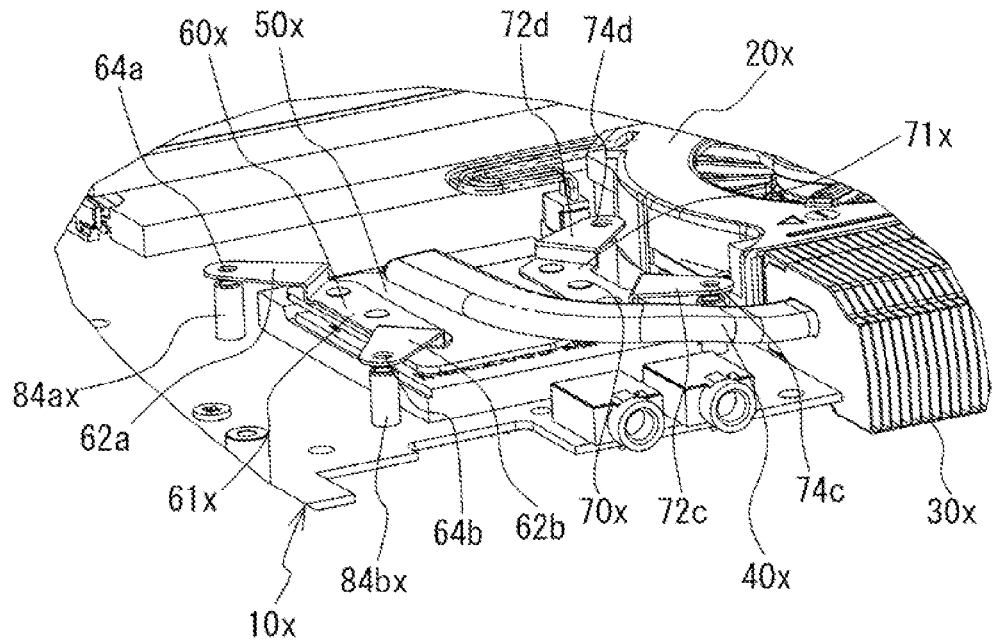
FIG. 13 is an explanatory view of the cooling device different from the present embodiment into the printed circuit board.

FIGS. 12 and 13 are explanatory views of the assembly of the cooling device R different from the present embodiment into a printed circuit board 10x.

A securing member 80x includes: a base portion 82x having a frame shape; and four projections 84ax to 84dx provided in the base portion 82x. The printed circuit board 10x is provided with four through-holes 14x through which the projections 84ax to 84dx can penetrate. Also, the printed circuit board 10x is provided with a heating part 15x as an object to be cooled by the cooling device Rx.

FIG. 13 illustrates the state before the projections 84ax to 84dx are secured to the elastic members 60x and 70x by the screws S. FIG. 13 illustrates the case where the printed circuit board 10x and the cooling device Rx are put on a work bench. As illustrated in FIG. 13, before the elastic members 60x and 70x are secured to the projections 84ax to 84dx, the metal plate 50x is spaced apart and floated from the heating part 15x. This is because a heat pipe 40x is made of metal having a rigidity. While an operator adjusts the position of the metal plate 50x such that the elastic members 60x and 70x are positioned above the projections 84ax to 84dx of the securing member 80x in the vertically upward direction, the metal plate 50x is pushed to the heating part 15x and the projections 84ax to 84dx are threadedly engaged with the screws S. Further, after the metal plate 50x is positioned by use of a jig positioning the metal plate 50x, the elastic members 60x and 70x have to be secured to the projections 84ax to 84dx by the screws S. In such a way, after the metal plate 50x is positionally adjusted in the direction parallel thereto, the metal plate 50x has to be pushed to the heating part 15x and the screws S have to be threadedly engaged with the projections 84ax to 84dx. This degrades the assembling property of the cooling device Rx.

However, as illustrated in FIGS. 9 and 10A, in the cooling device R according to the present embodiment, the projections 84a and 84b are inserted into through-holes 54a and 54b of the metal plate 50, respectively. Therefore, the metal plate 50 is positioned with respect to the printed circuit board 10 before the projections 84a to 84c are secured to the elastic members 60 and 70. Thus, the position of the metal plate 50 is not manually adjusted with respect to the securing member 80. Also, the metal plate 50 is not adjusted by use of a jig or the like. Thus, the screws S are threadedly engaged with the projections 84a to 84c in this state, whereby the elastic members 60 and 70 are secured to the projections 84a to 84c of the securing member 80. This improves the assembling property of the cooling device R according to the present embodiment. Thus, the securing member 80 functions as securing the metal plate 50, and further functions as positioning the metal plate 50 by fining the securing member 80 thereinto before securing the metal plate 50.

Also, even after the cooling device R is assembled into the printed circuit board 10, the state where the metal plate 50 is positioned by the securing member 80 is maintained. It is therefore possible to stably hold the position of the metal plate 50 with respect to the printed circuit board 10. In particular, when the force is exerted on the metal plate 50 in the direction perpendicular thereto, the position of the metal plate 50 can be stably held. Thus, in a case where the cooling device R is vibrated, the load applied to screws S, which secure the elastic members 60 and 70 and the securing member 80, can be reduced. This prevents the screws S from becoming loose and being removed.

Also, the securing member 80 is provided with three projections 84a to 83c. On the other hand, the securing member 80x is provided with four projections 84ax to 84dx. Thus, three screws have only to be fastened in order to assemble the securing member 80 and the metal plate 50, whereby the assembling property is improved. Also, the securing member 80 is provided with three projections 84a to 84c, whereby the cost can be reduced as compared with the securing member 80x. Further, the base portion 82 of the securing member 80 has a shape with two end portions, whereas the base portion 82x of the securing member 80x has a frame shape without an end portion. It is therefore possible to reduce the material cost of the securing member 80 as compared with the securing member 80x.

The variation example of the metal plate will be described.

Figure 14:
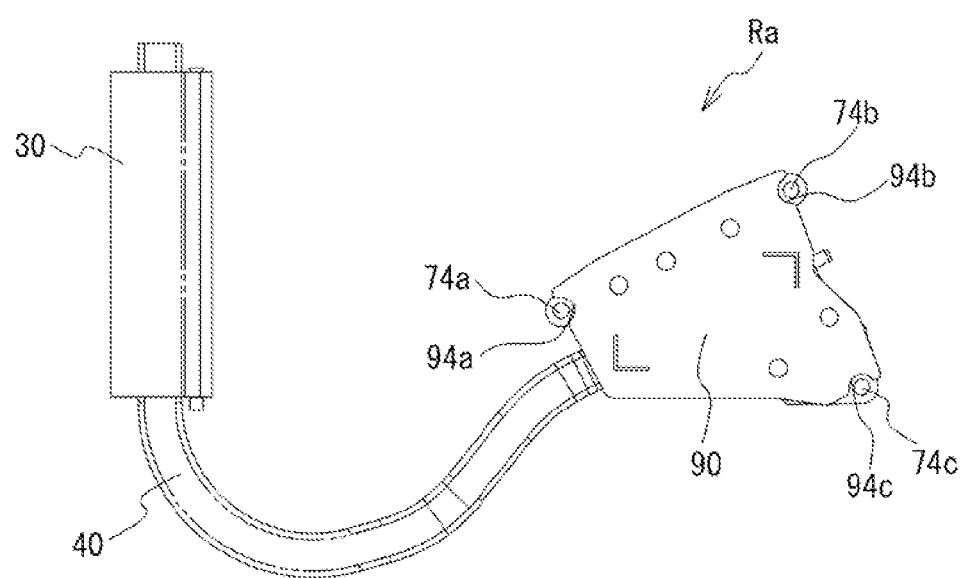
FIG. 14 is an explanatory view of a variation example of the metal plate.
Figure 15A:
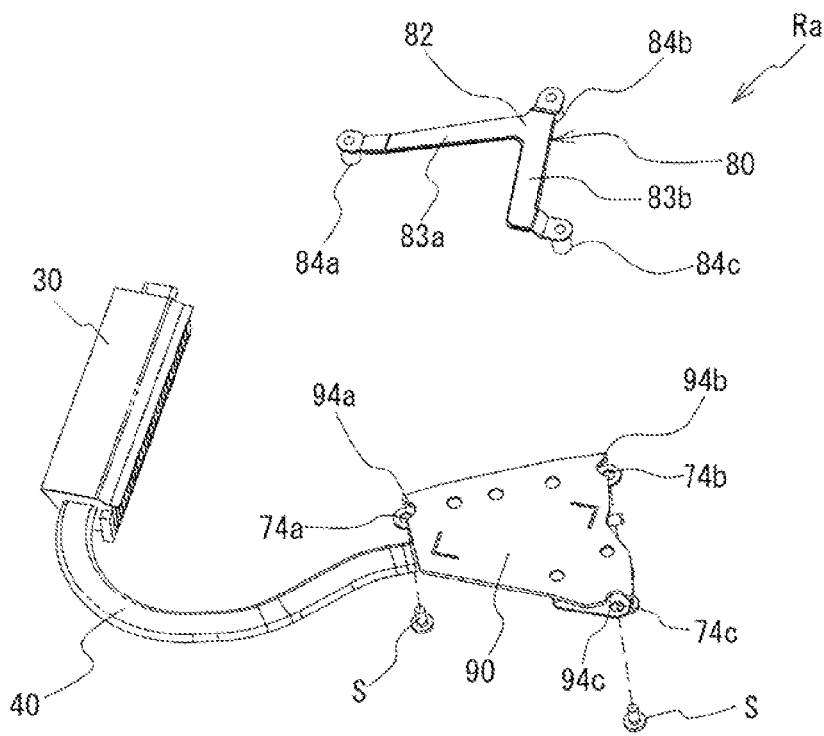
FIGS. 15A and 15B are explanatory views of the variation example of the metal plate.
Figure 15B:
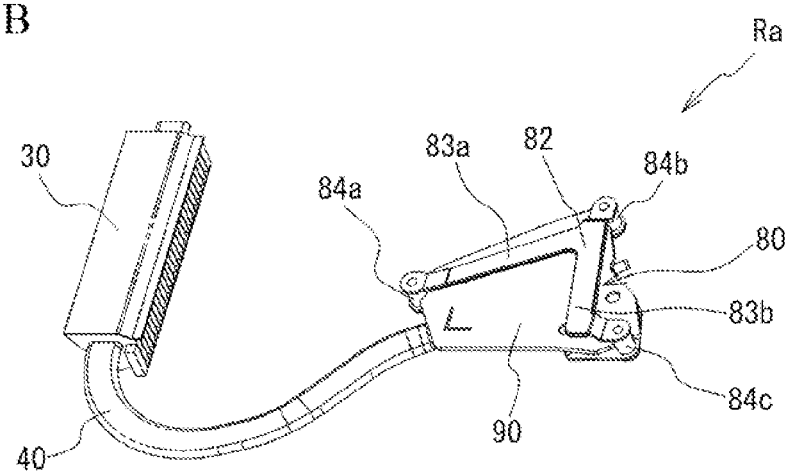

FIGS. 14, 15A, and 15B are explanatory views of the variation example of the metal plate. FIGS. 14, 15A, and 15B illustrate the bottom side of a metal plate 90 of a cooling device Ra. The metal plate 90 is connected with the heat pipe 40. The metal plate 90 is provided with three cutout portions 94a to 94c. The cutout portions 94a to 94c are respectively engaged with the projections 84a to 84c, thereby defining the position of the metal plate 90 with respect to the printed circuit board 10. As for the relationship between the positions of the projections 84a to 84c and the size of the metal plate, the metal plate may be provided with a cutout portion for the positioning in the above way.

Here, the metal plate 50 is compared with the metal plate 90. The metal plate 50 is formed with the two through-holes 54a and 54b, whereby the metal plate 50 can be positioned by the two projections 84a and 84b. Since the metal plate 90 is not formed with a through-hole, the metal plate 90 is provided with the three cutout portions 94a to 94c. The metal plate 90 is positioned by the three projections 84a to 84c. Therefore, the projection 84c does not have to be inserted into the metal plate 50. Thus, the metal plate 50 is downsized relative to the metal plate 90, thereby reducing the manufacturing cost of the metal plate 50. The metal plate 90 has to have a size so as to be engaged with the three projections 84a to 84c. Thus, the metal plate 90 is large relative to the metal plate 50, thereby improving the cooling efficiency of the heating part.

Next, a description will be given oldie variation example of the printed circuit board 10.

Figure 16:
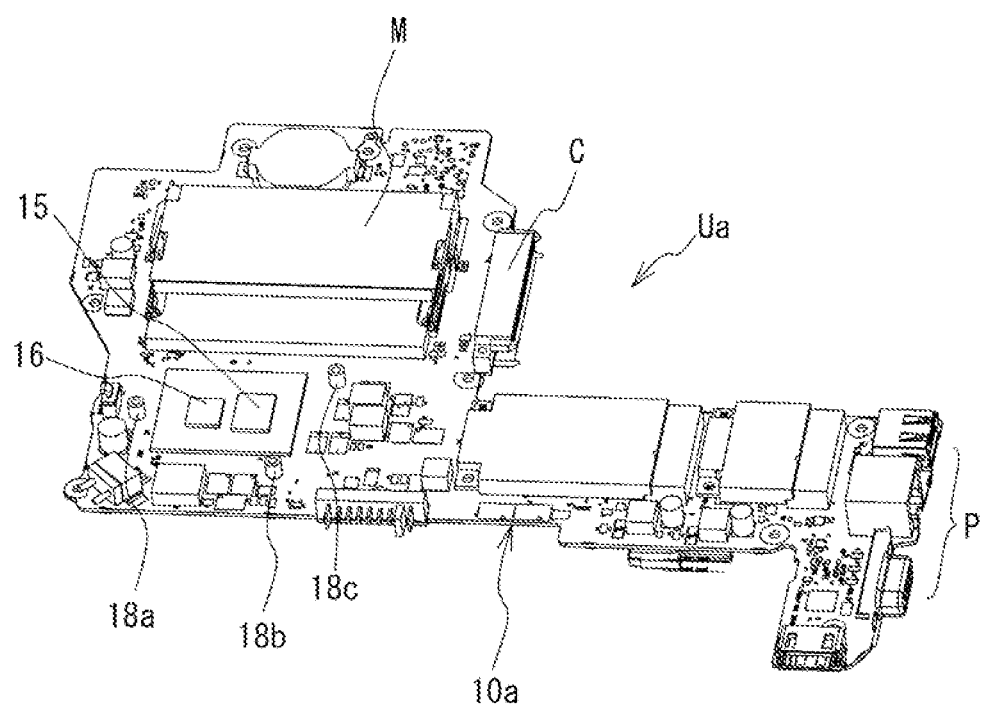
FIG. 16 is an explanatory view of a variation example of the printed circuit board.

FIG. 16 is an explanatory view of a printed circuit board 10a according to the variation example. The metal plate 50 may be positioned by projections 18a to 18c beforehand mounted on a surface of the printed circuit board 10a. The projections 18a to 18c function as securing the elastic members 60 and 70. The projections 18a to 18c functions substantially the same as the above mentioned projections 84a to 84c. However, each of the projections 18a to 18c is a single member having a cylindrical shape, unlike each of the projections 84a to 84c provided in the securing member 80. The projections 18a to 18c are provided around the heating parts 15 and 16 as the objects to be cooled. The projections 18a to 18c protrudes from the printed circuit board 10a in the same direction. Specifically, in the state where the cooling device R is assembled, the projections 18a to 18c protrude toward the metal plate 50.

In the present embodiment, the notebook computer has been described as an example of an electronic device, but is not limited. For example, the electronic device may be a portable device or a stationary device. For example, the portable device may be a portable game machine, and the stationary device may be a desktop computer, a television device, a magnetic disk player reading a magnetic disk, an audio device, or the like.

The number of the heating parts cooled by the cooling device according to the present embodiment may be one or more than two. The number of the projections provided in the securing member may be more than three. The metal plate 50 may be provided with more than two through-holes.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. A cooling device comprising:
a heat sink and a heat pipe that are connected with each other;
a metal plate that is connected with the heat pipe;
first and second elastic members provided on the metal plate, the first elastic member comprising a first securing portion attached to a first end of the metal plate, and first and second elastic pieces at opposite ends of the first securing portion, the first and second elastic pieces each including a respective securing hole, each respective securing hole located within the profile of the metal plate, the second elastic member comprising a second securing portion attached to a second end of the metal plate, and a third elastic piece, the third elastic piece including a securing hole, the securing hole being located outside the profile of the metal plate,
a securing member that is attachable with a printed circuit board on which a heating part is mounted, is able to be secured to the first and second elastic members such that the first and second elastic members are elastically deformed and the metal plate is pushed to the heating part, and is able to position the metal plate in a state where the securing member is not secured to the first and second elastic members, wherein
the first and second elastic members are spaced apart from the heat pipe when viewed in a direction perpendicular to the metal plate.

2. A printed circuit board unit comprising:
a cooling device comprising:
a heat sink and a heat pipe that are connected with each other;
a metal plate that is connected with the heat pipe;
first and second elastic members provided on the metal plate, the first elastic member comprising a first securing portion attached to a first end of the metal plate, and first and second elastic pieces at opposite ends of the first securing portion, the first and second elastic pieces each including a respective securing hole, each respective securing hole located within the profile of the metal plate, the second elastic member comprising a second securing portion attached to a second end of the metal plate, and a third elastic piece, the third elastic piece including a securing hole, the securing hole being located outside the profile of the metal plate; and
a securing member that is attachable with a printed circuit board on which a heating part is mounted, is able to be secured to the first and second elastic members such that the first and second elastic members are elastically deformed and the metal plate is pushed to the heating part, and is able to position the metal plate in a state where the securing member is not secured to the first and second elastic members; and the printed circuit board, wherein
the first and second elastic members are spaced apart from the heat pipe when viewed in a direction perpendicular to the metal plate.

3. The cooling device of claim 1, wherein
the securing member comprises first, second, and third projections that protrude toward the metal plate side from the printed circuit board, and
the metal plate comprises first, second, and third cutout portions with which the first, second, and third projections are respectively engaged.

4. The cooling device of claim 1, wherein
the securing member comprises:
- a projection that is able to penetrate through a through-hole provided in the printed circuit board and is able to fit into the metal plate; and
- a base portion that is provided with the projection, is able to be arranged such that the printed circuit board is sandwiched between the base portion and the metal plate, and is shaped to have two end portions.

5. A printed circuit board unit comprising:
a cooling device comprising:
- a heat sink and a heat pipe that are connected with each other;
- a metal plate that is connected with the heat pipe;
- an elastic member that is provided on the metal plate; and
- a securing member that is attachable with a printed circuit board on which a heating part is mounted, is able to be secured to the elastic member such that the elastic member is elastically deformed and the metal plate is pushed to the heating part, and is able to position the metal plate in a state where the securing member is not secured to the elastic member; and the printed circuit board, wherein
the elastic member is spaced apart from the heat pipe when viewed in a direction perpendicular to the metal plate, and
the securing member has a substantially L-shape.

6. An electronic device comprising:
a printed circuit board unit comprising:
   a cooling device comprising:
   - a heat sink and a heat pipe that are connected with each other;
   - a metal plate that is connected with the heat pipe;
   - first and second elastic members provided on the metal plate, the first elastic member comprising a first securing portion attached to a first end of the metal plate, and first and second elastic pieces at opposite ends of the first securing portion, the first and second elastic pieces each including a respective securing hole, each respective securing hole located within the profile of the metal plate, the second elastic member comprising a second securing portion attached to a second end of the metal plate, and a third elastic piece, the third elastic piece including a securing hole, the securing hole being located outside the profile of the metal plate; and
   - a securing member that is attachable with a printed circuit board on which a heating part is mounted, is able to be secured to the first and second elastic members such that the first and second elastic members are elastically deformed and the metal plate is pushed to the heating part, and is able to position the metal plate in a state where the securing member is not secured to the first and second elastic members; and
   the printed circuit board; and
a housing that houses the printed circuit board unit, wherein
the first and second elastic members are spaced apart from the heat pipe when viewed in a direction perpendicular to the metal plate.

7. The cooling device of claim 1, wherein
the securing member comprises:
- a projection that is able to penetrate through a through-hole provided in the printed circuit board and is able to fit into the metal plate; and
- a base portion that is provided with the projection, and is able to be arranged such that the printed circuit board is sandwiched between the base portion and the metal plate, the base portion comprises first and second extended portions that are continuous to each other, and extend in respective different directions,
an end portion of the first extended portion is spaced apart from an end portion of the second extended portion.

* * * * *